(12) United States Patent
Yang et al.

(10) Patent No.: US 7,608,875 B2
(45) Date of Patent: Oct. 27, 2009

(54) METHOD AND APPARATUS FOR BLOCKING LIGHT TO PERIPHERAL CIRCUITRY OF AN IMAGER DEVICE

(75) Inventors: Zhaohui Yang, Boise, ID (US); Ulrich C. Boettiger, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 504 days.

(21) Appl. No.: 11/289,553

(22) Filed: Nov. 30, 2005

(65) Prior Publication Data

US 2007/0120162 A1    May 31, 2007

(51) Int. Cl.
*H01L 21/00* (2006.01)
(52) U.S. Cl. .............. 257/294; 257/E27.131; 257/E31.122
(58) Field of Classification Search ......... 257/291–294, 257/E27.131, E27.132, E27.133, E31.122
See application file for complete search history.

(56) References Cited

U.S. PATENT DOCUMENTS

| | | | |
|---|---|---|---|
| 6,140,630 A | 10/2000 | Rhodes | |
| 6,204,524 B1 | 3/2001 | Rhodes | |
| 6,304,384 B1 * | 10/2001 | Nishikawa | 359/619 |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,737,626 B1 * | 5/2004 | Bidermann et al. | 250/208.1 |
| 2004/0241898 A1 * | 12/2004 | Sakoh et al. | 438/72 |
| 2006/0202295 A1 * | 9/2006 | Wu et al. | 257/432 |

FOREIGN PATENT DOCUMENTS

| | | |
|---|---|---|
| EP | 1389804 | 2/2004 |
| EP | 1487020 | 12/2004 |

OTHER PUBLICATIONS

International Search Report and Written Opinion from PCT/US2006/045805, dated May 31, 2007.

* cited by examiner

*Primary Examiner*—Thomas L Dickey
*Assistant Examiner*—Fazli Erdem
(74) *Attorney, Agent, or Firm*—Dickstein Shapiro LLP (57) ABSTRACT

Methods and apparatuses are disclosed which provide imager devices having a light blocking material layer formed over peripheral circuitry outside a pixel cell array.

28 Claims, 12 Drawing Sheets

METHOD AND APPARATUS FOR BLOCKING LIGHT TO PERIPHERAL CIRCUITRY OF AN IMAGER DEVICE

FIELD OF THE INVENTION

The present invention relates generally to integrated circuits having imager devices formed thereon, and the methods of making said integrated circuits.

BACKGROUND OF THE INVENTION

Solid state imager dies, such as a CMOS imager die, typically contain thousands of pixel cells in a pixel cell array on a single chip. Pixel cells convert radiant energy into an electrical signal that can then be stored and recalled by an electrical device such as, for example, a processor. The electrical signals that are stored may be recalled to produce an image on, for example, a computer screen or a printable media.

Exemplary CMOS imaging circuits, processing steps thereof, and detailed descriptions of the functions of various CMOS elements of an imaging circuit are described, for example, in U.S. Pat. Nos. 6,140,630; 6,376,868; 6,310,366; 6,326,652; 6,204,524; 6,333,205 each of which being assigned to Micron Technology, Inc. The disclosures of each of the forgoing patents are hereby incorporated by reference in their entirety.

Figure 1:
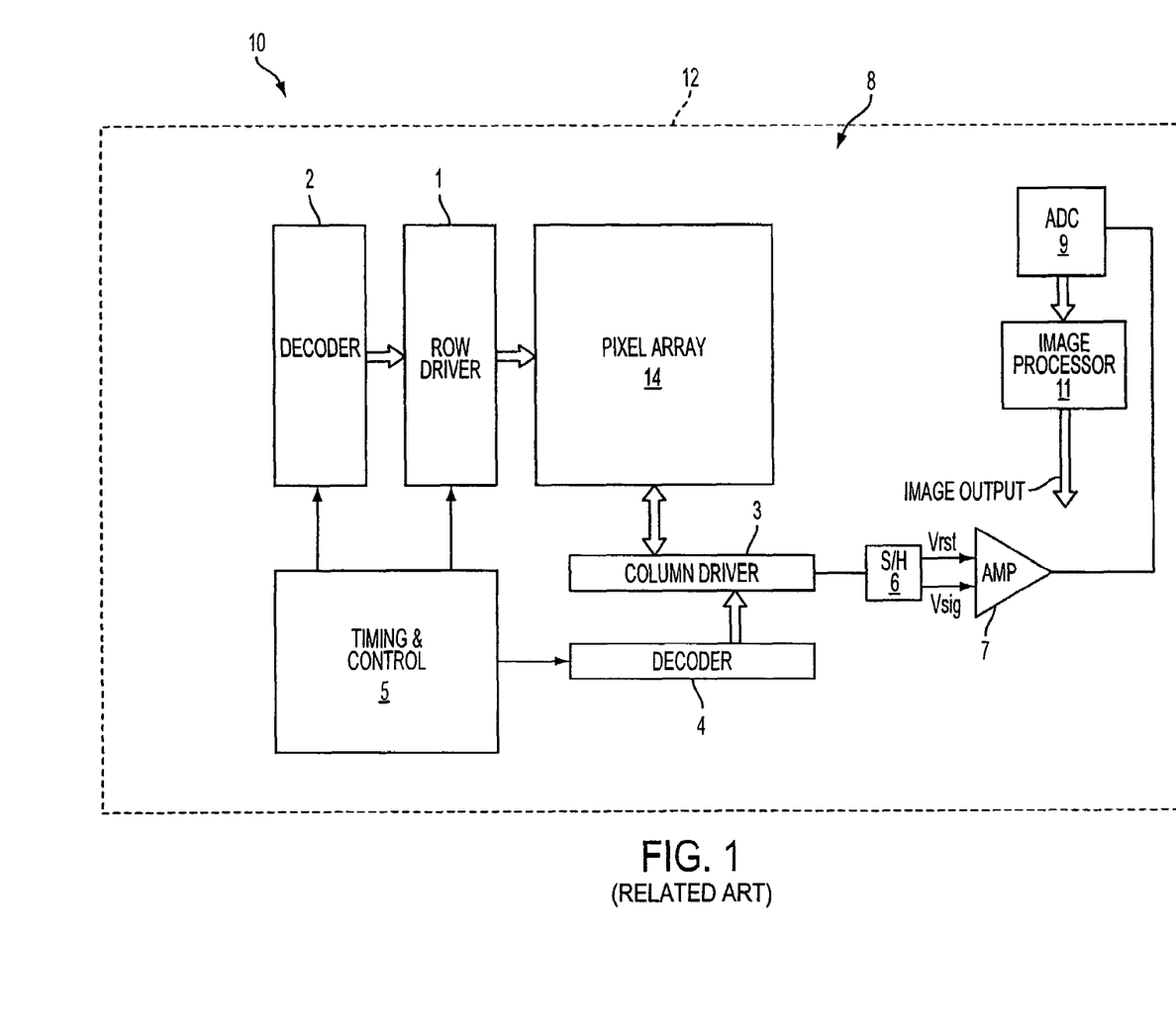
FIG. 1 illustrates a block diagram of a conventional integrated circuit having an imager device.

FIG. 1 illustrates a block diagram of a conventional integrated circuit 10. The integrated circuit includes a die 12 having an imager device 8 included thereon; as illustrated and for exemplary discussions, the imager device is a CMOS device 8. The imager device 8 has a pixel cell array 14 that comprises a plurality of pixel cells arranged in a predetermined number of columns and rows. The pixel cells of each row in the pixel cell array 14 are all turned on at the same time by a row select line, and the pixel cells of each column are selectively output by respective column select lines. A plurality of row and column lines are provided for the entire pixel cell array 14. The row lines are selectively activated in sequence by a row driver 1 in response to row address decoder 2 and the column select lines are selectively activated in sequence for each row activation by a column driver 3 in response to column address decoder 4. The imager device 8 is operated by the control circuit 5, which controls address decoders 2, 4 for selecting the appropriate row and column lines for pixel cell readout, and row and column driver circuitry 1, 3 to apply driving voltage to the drive transistors of the selected row and column lines.

The pixel cell output signals typically include a pixel reset signal $V_{rst}$ taken from a charge storage node when it is reset and a pixel image signal $V_{sig}$, which is taken from the storage node after charges generated by an image are transferred to the node. The $V_{rst}$ and $V_{sig}$ signals are read by a sample and hold circuit 6 and are subtracted by a differential amplifier 7, which produces a difference signal ($V_{rst}$-$V_{sig}$) for each pixel cell, which represents the amount of radiant energy impinging on the pixel cell. The signal difference is digitized by an analog-to-digital converter 9. The digitized signal difference is then fed to an image processor 11 to form and output a digital image. In addition, as depicted in FIG. 1, the imager device 8 components may all be included on a single die 12 to form the integrated circuit 10 or the components may be integrated on a plurality of dies. The integrated circuit(s) 10 can be included in a number of image capture and/or reproduction applications, including, but not limited to, sensors, cameras, personal digital assistants (PDAs), scanners, facsimile machines, and copiers.

Radiant energy directed towards the pixel cell array 14 during image capture also strikes the peripheral circuitry of the imager device 8, which can interfere with proper image capture. For example, radiant energy could strike the circuitry, e.g., transistors and capacitors (not shown), of the row driver 1, decoders 2, 4, analog-to-digital converter 9, image processor 11, timing and control circuit 5, and/or the column driver 3. The peripheral circuitry typically comprises transistors, capacitors, and other components that are susceptible to noise when exposed to varying amounts of radiant energy. This can lead to image artifacts, such as column-banding, significantly degrading imager device performance.

Accordingly, there is a desire and need for a solid state imager device that has eliminated or reduced the amount of radiant energy striking the peripheral circuitry of the imager device, thereby decreasing the amount of noise in the image, and leading to better image quality.

BRIEF SUMMARY OF THE INVENTION

Exemplary embodiments of the present invention provide integrated circuits having solid state imager devices formed thereon, with a light blocking material layer formed over peripheral circuitry associated with the imager devices, to eliminate or reduce the amount of radiant energy striking the peripheral circuitry. The present invention also relates to the methods of making such integrated circuits.

BRIEF DESCRIPTION OF THE DRAWINGS

The above-described features and advantages of the invention will be more clearly understood from the following detailed description, which is provided with reference to the accompanying drawings in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer," "die," and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer," "die," and "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-sapphire, germanium, or gallium arsenide, or other semiconductor materials.

The term "pixel cell" refers to a picture element unit cell containing a photosensor and other devices for converting radiant energy into an electrical signal and providing pixel cell output. For purposes of illustration, portions of representative pixel cells are illustrated in the figures and description herein and, typically, fabrication of all imager pixel cells in an imager array will proceed simultaneously in a similar fashion. Although exemplary embodiments of the invention are discussed below in relation to a CMOS imager device, the invention is not so limited, and is applicable to any solid state imagers having an array of imaging pixel cells.

The term "opaque material" or "substantially opaque material" refers to any material layer capable of substantially blocking the passage of radiant energy and especially light.

Figure 2:
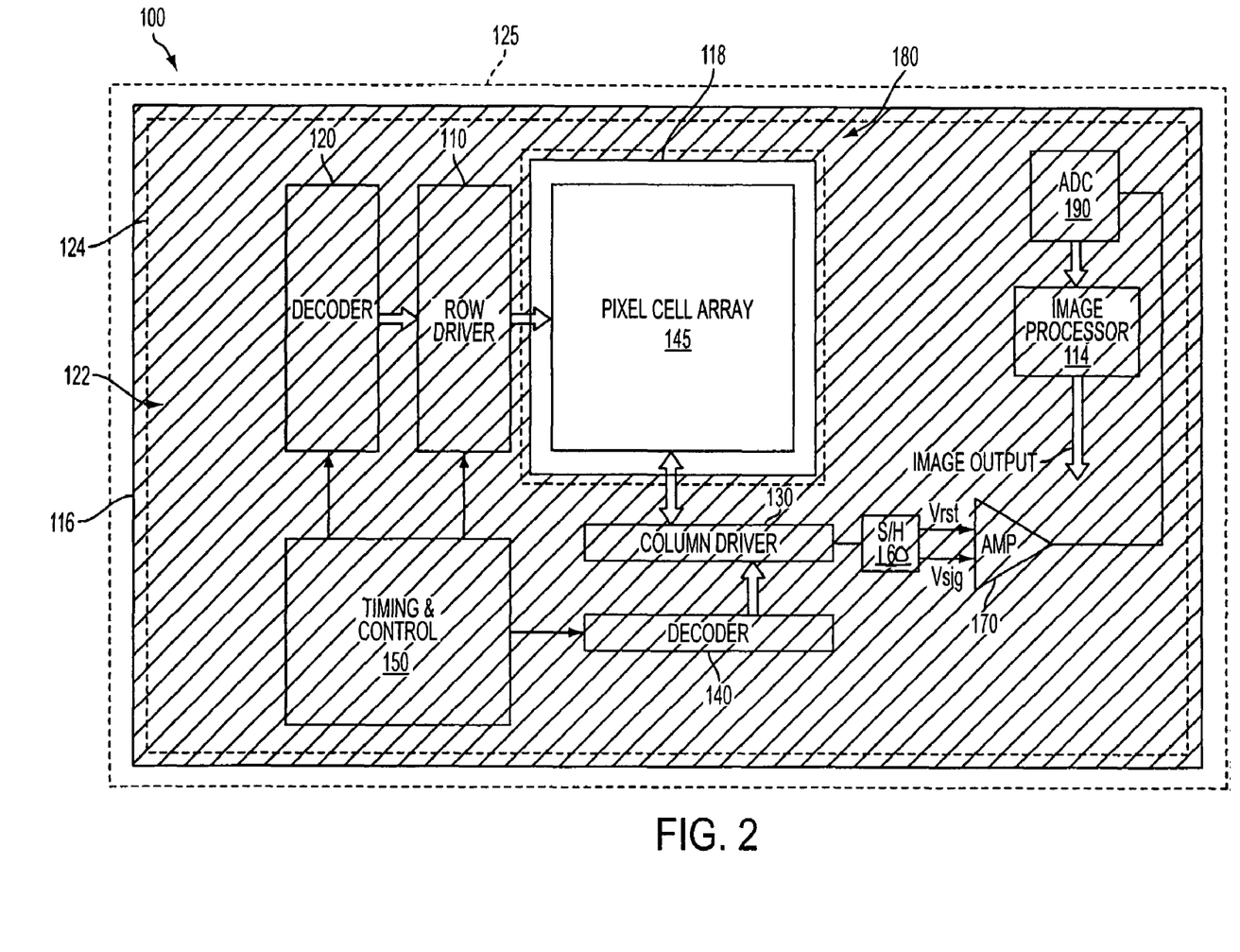
FIG. 2 illustrates a block diagram of an integrated circuit constructed in accordance with an exemplary embodiment of the invention.

Referring now to the figures, where like reference numbers designate like elements, FIG. 2 illustrates an embodiment of an integrated circuit 100 constructed in accordance with an embodiment of the invention. Specifically, FIG. 2 illustrates the integrated circuit 100 having a CMOS imager device 180 formed on a die 125. The imager device 180 includes a pixel cell array 145, and peripheral readout circuitry 122 that includes a row driver 110, column driver 130, row decoder 120, column decoder 140, timing and control circuit 150, analog-to-digital converter 190, sample and hold circuit 160, amplifier 170, and image processor 114.

Notably, the FIG. 2 integrated circuit 100 includes a substantially opaque material layer 124 formed over the peripheral circuitry 122. The material layer 124 is coupled to a first frame 116 that forms a perimeter around the peripheral circuitry 122 and a second frame 118 that forms a perimeter around the pixel cell array 145. The illustrated first and second frames 116, 118 are formed such that the second frame 118 is formed within a perimeter of the first frame 116. The material layer 124 protects the peripheral circuitry 122 from impinging radiant energy, while allowing radiant energy to strike the pixel cell array 145. The material layer 124 may reduce noise during pixel cell readout by protecting the transistors and capacitors (not shown) of the various components of the peripheral circuitry 122 from radiant energy. The material layer 124 could be formed of any substantially opaque material, including, but not limited to, a negative photoresist.

Figure 3:
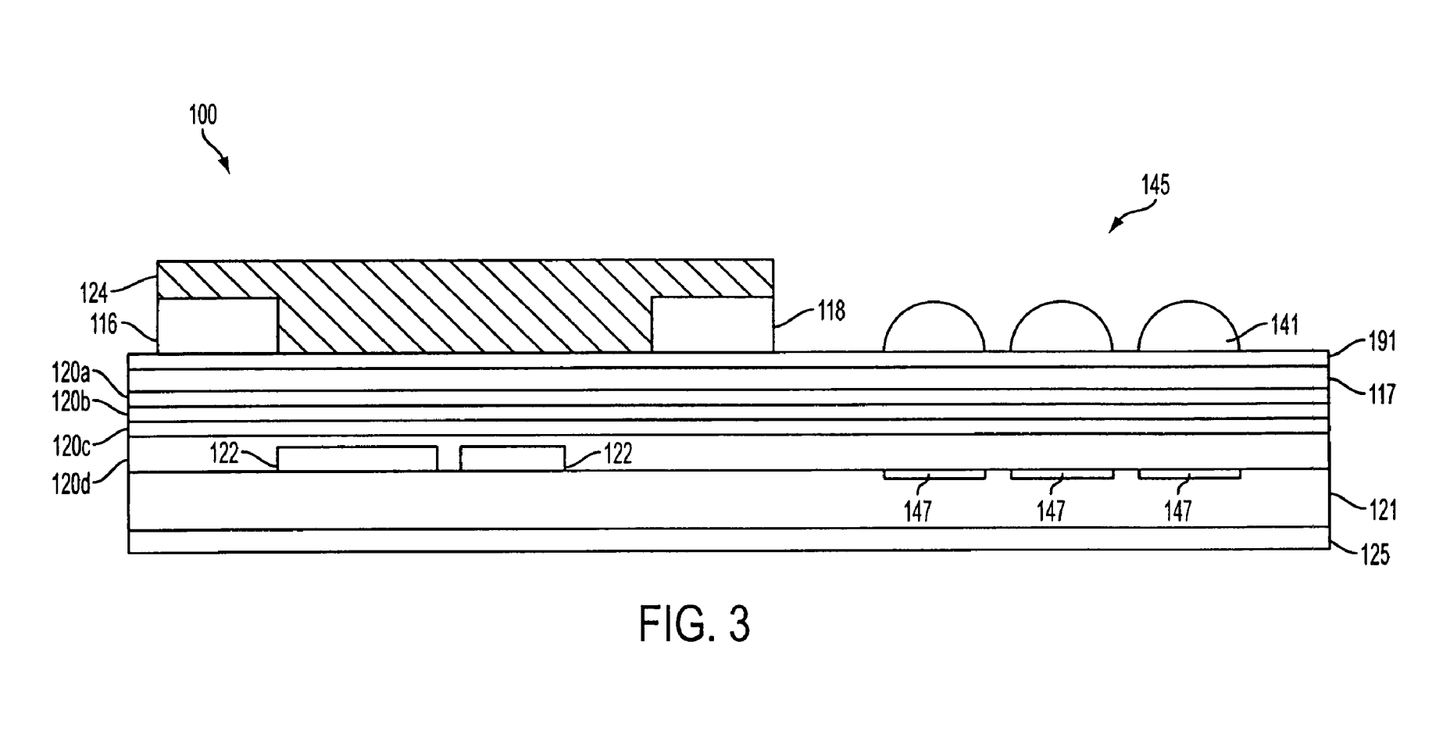
FIG. 3 illustrates a partial cross-sectional view of the FIG. 2 integrated circuit.

FIG. 3 illustrates a partial cross sectional view of the FIG. 2 integrated circuit 100. As illustrated, the integrated circuit 100 has a substantially opaque material layer 124 formed over the peripheral circuitry 122 that prevents radiant energy from striking the peripheral circuitry 122, resulting in the reduction of noise during the readout process and the elimination or reduction of image artifacts such as column banding. FIG. 3 also illustrates a partial cross sectional view of the pixel cell array 145 having an array of microlenses 141, which direct radiant energy onto respective photoreactive areas 147 formed in an epitaxial layer 121 on the die 125. The illustrated microlenses 141 are formed over a planarization layer 191, which is formed over a color filter array 117 and other conventional dielectric and electrode material layers 120a, 120b, 120c, 120d.

Color filter arrays (e.g., color filter array 117) are typically used in pixel cell arrays (e.g., pixel cell array 145) to allow radiant energy within a particular wavelength range, which corresponds to a particular color, to reach the pixel cells. For example, color filter arrays include filters that allow wavelengths of light associated with the colors red, blue, or green (RBG) to create corresponding red, blue, or green pixel cells. Yet other color filter arrays allow wavelengths of light associated with the colors, cyan, magenta, and yellow (CMY) to create corresponding cyan, magenta, and yellow pixel cells.

The FIG. 3 material layer 124 is coupled to first and second frames 116, 118, which are formed as mesas over the planarization layer 191. The illustrated material layer 124 is formed only over the peripheral circuitry 122, thereby allowing radiant energy to strike the microlenses 141. Although illustrated as being formed on the same material layer (i.e., planarization layer 191) as the microlens array 141, the material layer 124 and first and second frames 116, 118 are not limited to the illustrated embodiment, and could be formed on other material layers of the integrated circuit 100, as is further discussed below with respect to FIGS. 6-8.

Figure 4:
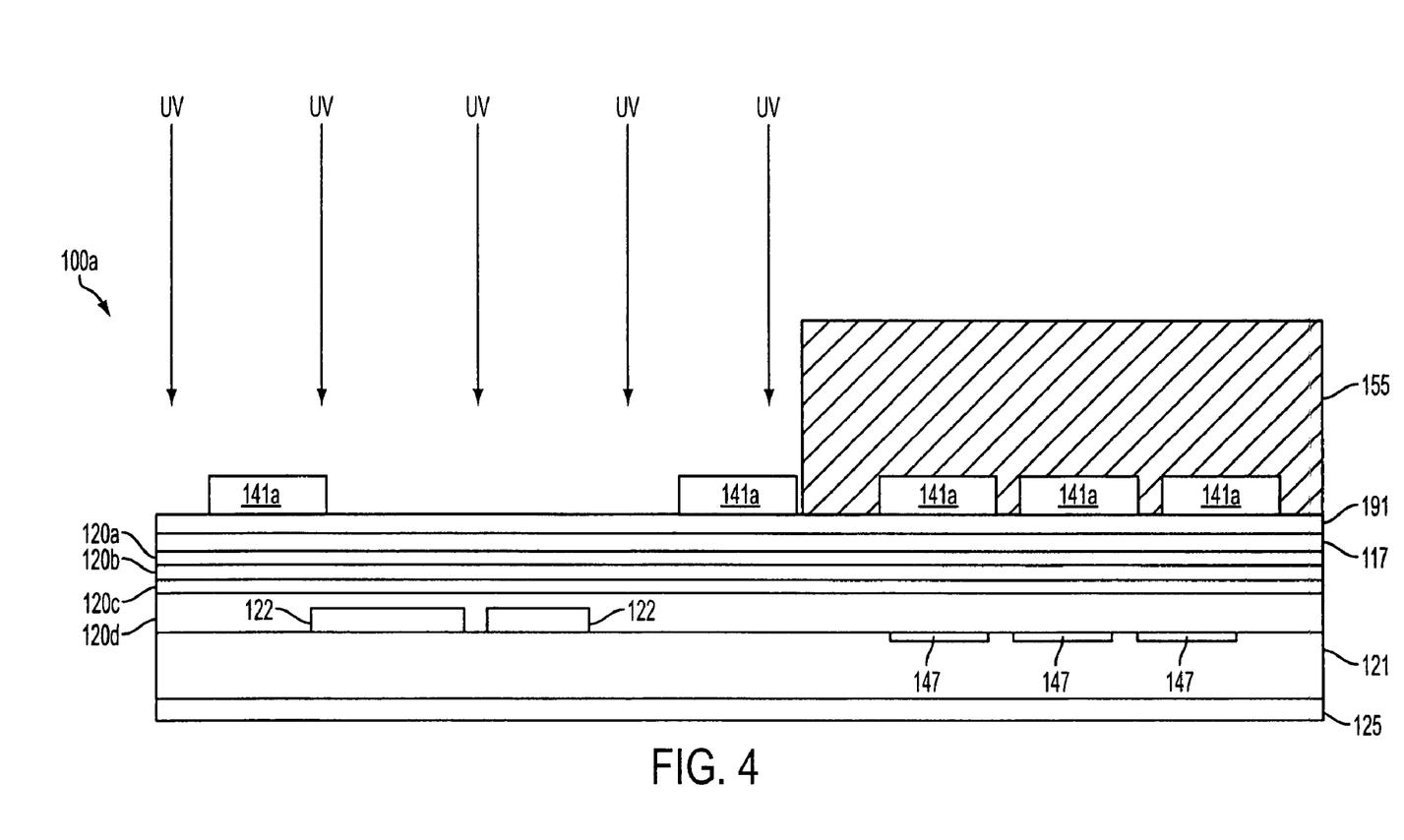
FIGS. 4-6 illustrate partial cross-sectional views of an exemplary method of fabricating the FIG. 2 integrated circuit.
Figure 5:
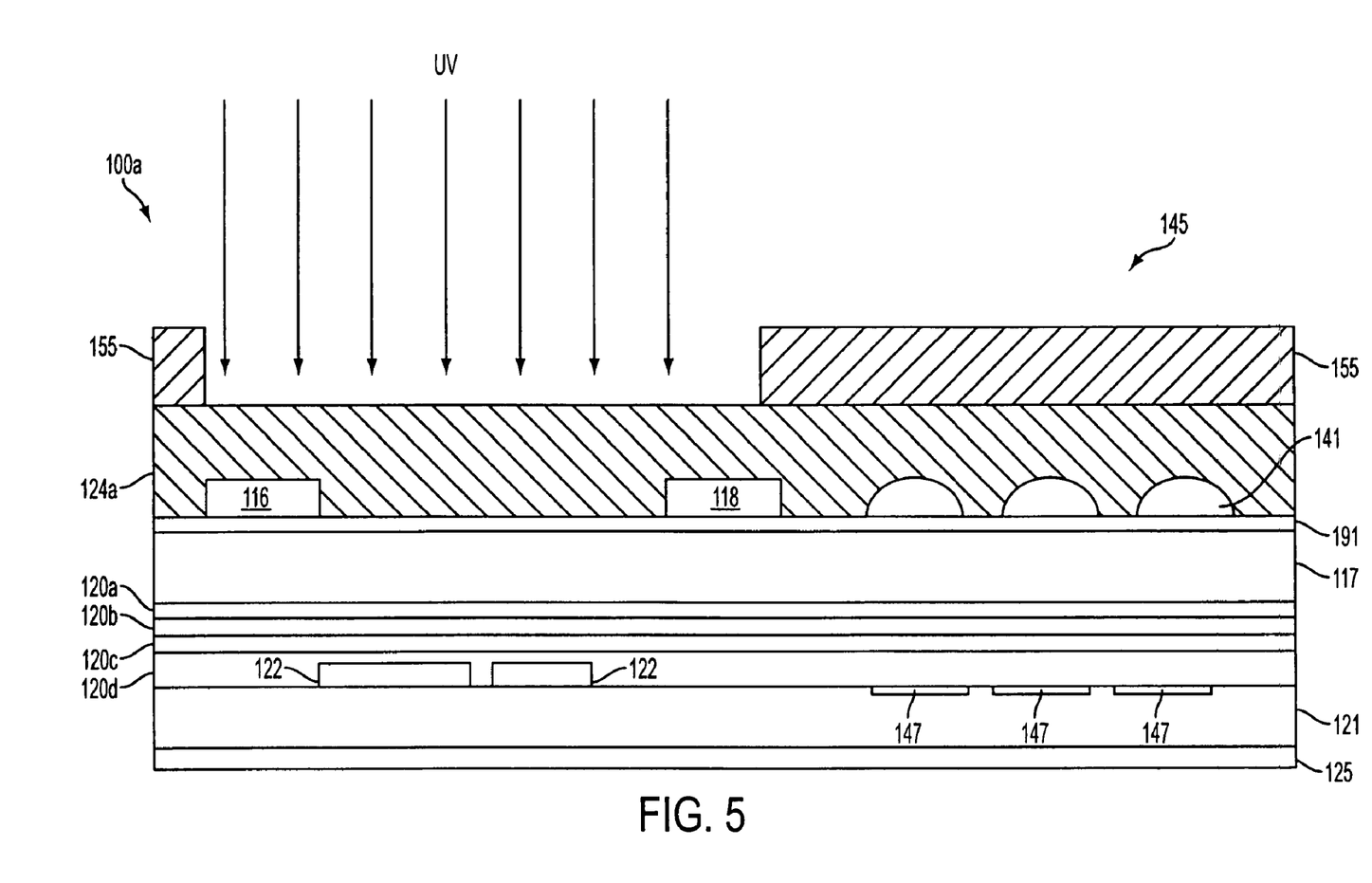
Figure 6:
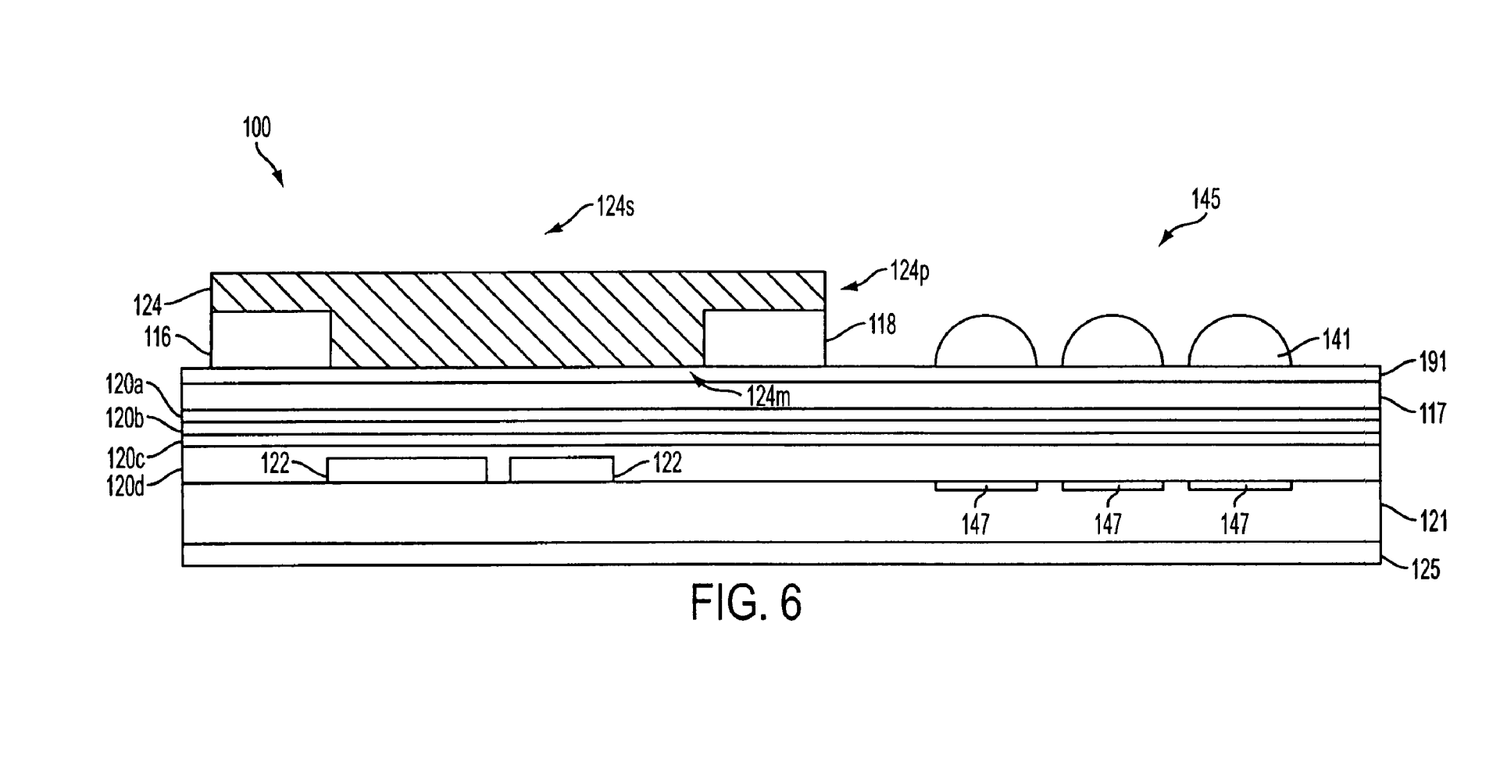

FIGS. 4-6 illustrate an exemplary method of fabricating the FIG. 2 integrated circuit 100. As illustrated in FIG. 4 an intermediate structure 100a includes the die 125 having an epitaxial layer 121 formed thereon. Photoreactive areas 147 and peripheral circuitry 122 are formed in association with the epitaxial layer 121. The planarization layer 191 is formed over the color filter array 117 and other material layers 120a, 120b, 120c, 120d, which are formed over the epitaxial layer 121. Although the photoreactive areas 147 and peripheral circuitry 122 are illustrated as being formed within and over the epitaxial layer 121, respectively, this is only exemplary and not intended to be limiting in any way.

Precursor blocks 141a are patterned over the planarization layer 191. The precursor blocks 141a could be any material of sufficient thickness suitable for direct lithographic patterning (e.g., generally photoresist or specifically the material typically used in the formation of microlenses (e.g., microlens array 141 of FIG. 3). For example, the precursor blocks 141a could be formed of materials selected from the group consisting of polymethylmethacrylate, polycarbonate, polyolefin, cellulose acetate butyrate, or polystyrene; a polyimide; a thermoset resin such as an epoxy resin; a photosensitive gelatin; or a radiation curable resin such as acrylate, methacrylate, urethane acrylate, epoxy acrylate, or polyester acrylate.

The precursor blocks 141a that are patterned to form the first and second frames 116, 118 (e.g., FIG. 2), can be selectively treated with UV light such they are less susceptible to subsequent reflow processes, as discussed below with respect to FIG. 5. The precursor blocks 141a that are patterned over the photoreactive areas 147 are selectively protected by a mask 155 from the UV light.

FIG. 5 illustrates the precursor blocks 141a (FIG. 4) that were patterned over the photoreactive areas 147, and not treated with UV light are reflowed to form an array of microlenses 141. A negative photoresist layer 124a is formed over the intermediate structure 100a. A mask 155 is provided over selected portions of the material layer 124a (e.g., over the pixel cell array 145) over which the material layer 124 (FIG. 3) is not desired. UV light is directed upon the negative photoresist such that the negative photoresist exposed to light cross links, and becomes insoluble to a developer.

FIG. 6 illustrates the removal of the mask, and subsequent exposure of the intermediate structure 100a (FIG. 5) to a developer (not shown). The developer attacks the portions of the photoresist 124a (FIG. 5) that were not exposed to UV light (i.e., not cross linked), while the portion of the photoresist 124a (FIG. 5) that was previously properly cross linked remains as material layer 124.

Creating the first and second frames 116, 118 allows for a thinner portion 124p of the material layer 124 to be formed in these areas; the thinner portion 124p of the material layer 124 requires less exposure to UV light for proper cross linking than a middle portion 124m that is located between the first and second frames 116, 118. For example, the thinner portions 124p of the material layer 124 may have a thickness of about 0.5 μm and the middle portion 124m of the material layer 124 may have a thickness of about 1 μm or more. During the treatment of the photoresist 124a (FIG. 5), the thinner portions 124p may require an exposure of about 200 mJ to properly cross link the photoresist 124a (FIG. 5). On the other hand, the middle portion 124m may require an exposure of about 1600 mJ for proper cross linking. An exposure of 1600 mJ would significantly reduce the production throughput of the exposure tool, and increase the device cost. It can also lead to material outgassing and exposure tool damage. Finally, a high exposure like this could lead to an increased level of stray light and cause photoresist residue issues in the active array area which can negatively impact the performance of the imager.

In addition, the first and second frames 116, 118 prevent developer from attacking the middle portion 124m of the photoresist 124a (FIG. 5). Any photoresist 124a (FIG. 5) that is not properly cross linked would likely be localized in the middle portion 124m due to the possibility that the UV light may not penetrate the top surface 124s of the photoresist 124a (FIG. 5) deep enough to reach the middle portion 124m. Therefore, the first and second frames 116, 118 act as barriers to subsequent processes using a developer. As long as the top surface of the material layer 124 and the thinner portions 124p of the material layer 124 over the first and second frames 116, 118 are exposed to sufficient UV dosages to sufficiently cross link, a high quality material layer 124 can be formed to block light from striking the peripheral circuitry 122.

Although the FIG. 6 material layer 124 is described as having a thickness of 0.5 μm at thinner portions 124p of the material layer 124 and 1 μm at a middle portion 124m of the material layer 124, it is not intended to be limiting in any way. For example, the thinner portions 124p could be greater than or less than 0.5 μm, and the middle portion 124m could similarly be greater than or less than 1 μm, depending upon the application. Similarly the exposure dose of the photoresist 124a (FIG. 5) to UV light could be greater than or less than 200 mJ, depending upon the desired thickness of the material layer 124 and its exposure sensitivity.

It should be noted that although the first and second frames 116, 118 are illustrated as having a substantially rectangular shape in the cross-sectional illustration, it is not intended to be limiting. For example, the first and second frames could have a substantially semi-elliptical, substantially semi-circular, or substantially trapezoidal shape (if desired), depending on the area of the pixel cell array 145 and that of the peripheral circuitry 122.

It should also be noted that the treatment of the precursor blocks 141a with UV, as discussed above with respect to FIG. 4, is optional, and not intended to be limiting. For example, the precursor blocks 141a (FIG. 4) that are patterned to create the first and second frames 116, 118 (FIG. 6) could be reflowed along with the precursor blocks 141a (FIG. 4) patterned to form the array of microlenses 141 (FIG. 6), such that the first and second frames 116, 118 (FIG. 6) are formed to have a semi-circular shape (e.g., FIG. 11).

It should further be noted that the first and second frames 116, 118 need not be formed of the same material as the array of microlenses 141. For example, the first and second frames 116, 118 could be formed of a positive or negative resist material, or any other material.

Figure 7:
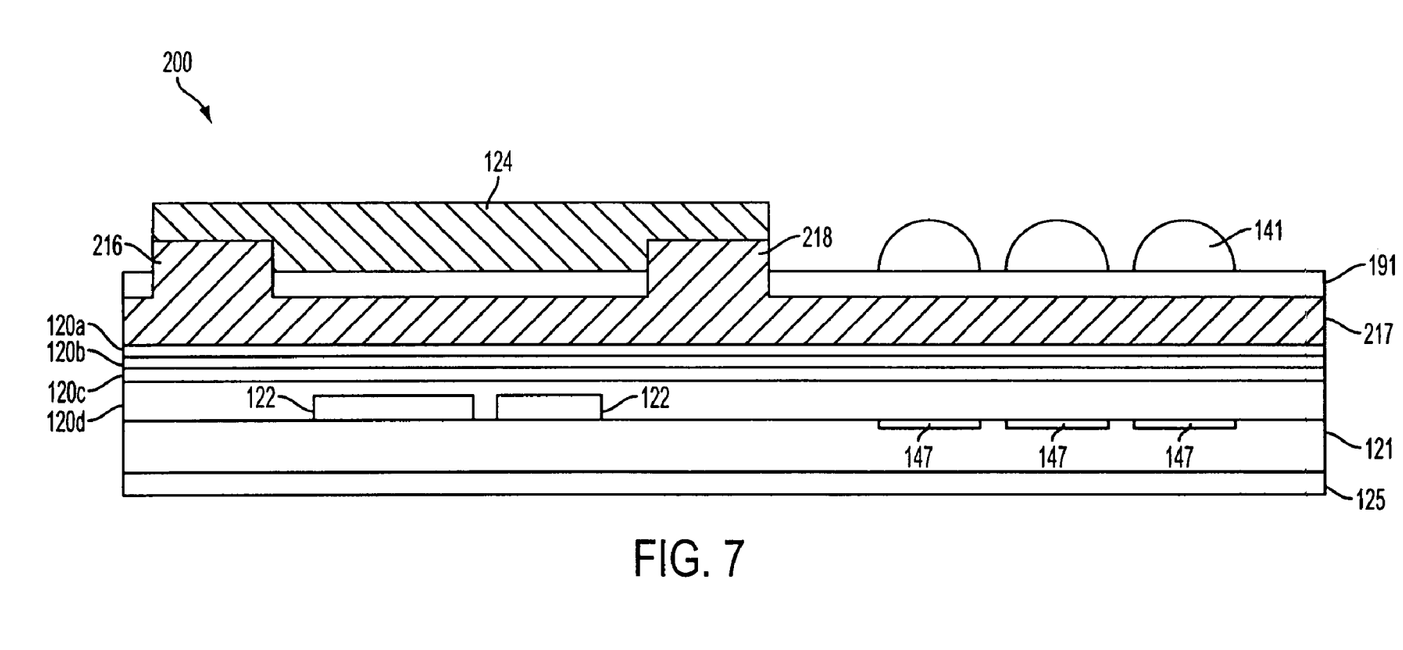
FIG. 7 illustrates a partial cross-sectional view of an integrated circuit constructed in accordance with a second exemplary embodiment of the invention.

FIG. 7 illustrates a partial cross-sectional view of an integrated circuit 200 constructed in accordance with a second embodiment of the invention in which first and second frames 216, 218 are formed as mesas of a color filter array 217. The first and second frames 216, 218 are formed by providing a color filter array precursor layer, and forming trenches in the precursor layer, thereby creating corresponding mesas that form the first and second frames 216, 218. The planarization layer 191 is selectively formed over the color filter array 217 such that the planarization layer 191 is formed within the trenches formed in the color filter array precursor layer (i.e., not over the mesas that form the first and second frames 216, 218). A microlens array 141 is formed over the planarization layer 191. The material layer 124 is formed over the first and second frames 216, 218, and in between the first and second frame 116, 118, in a substantially similar fashion as discussed above with respect to FIGS. 5 and 6.

Figure 8:
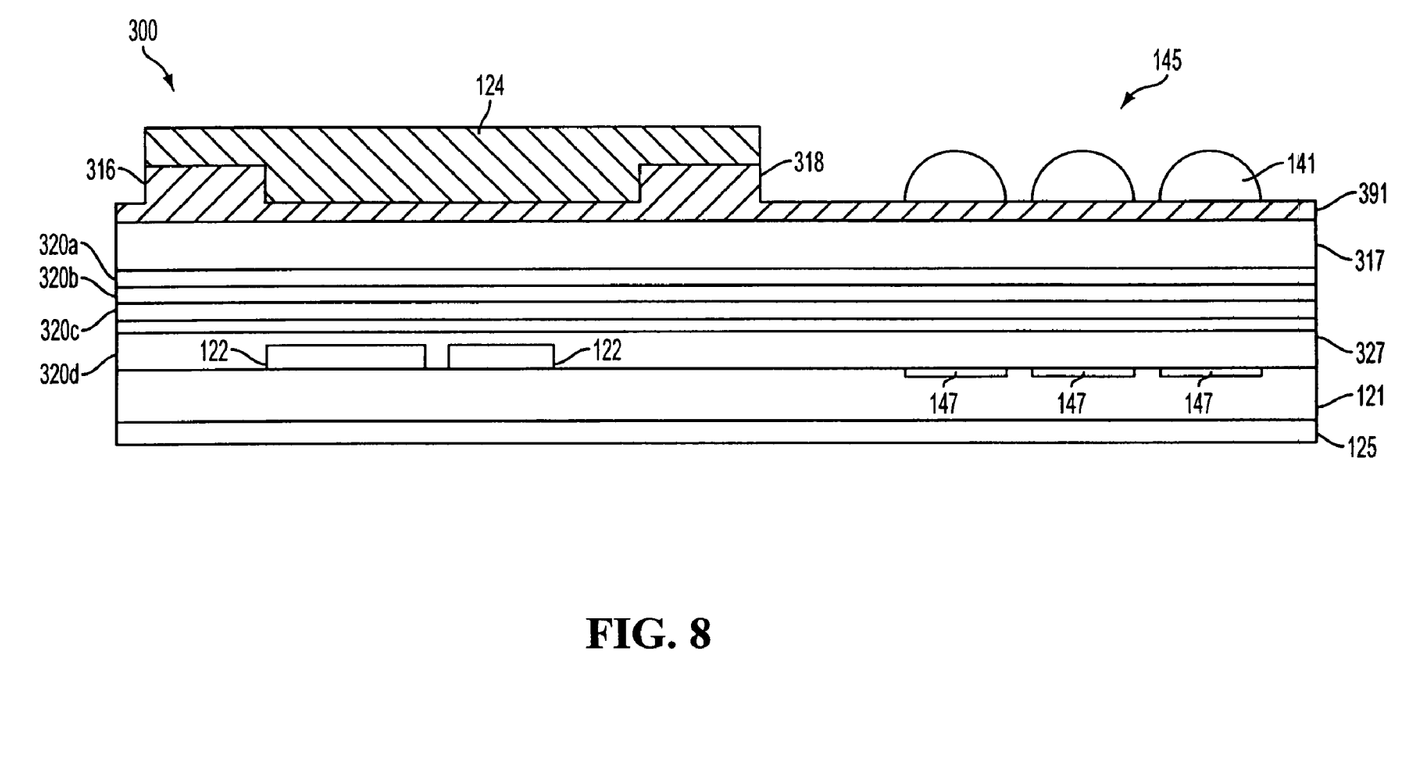
FIG. 8 illustrates a partial cross-sectional view of an integrated circuit constructed in accordance with a third exemplary embodiment of the invention.

FIG. 8 illustrates a partial cross-sectional view of an integrated circuit 300 constructed in accordance with a third embodiment of the invention in which first and second frames 316, 318 are formed as mesas of a planarization layer 391. The first and second frames 316, 318 could be formed by forming a planarization precursor layer, and etching trenches within the planarization precursor layer, thereby creating corresponding mesas that form the first and second frames 316, 318. FIG. 8 illustrates a color filter array 317 formed beneath the planarization layer 391. A microlens array 141 is subsequently formed over the planarization layer 391. The material layer 124 is formed in a substantially similar fashion as discussed above with respect to FIGS. 5 and 6.

It should be noted that although FIGS. 6-8 illustrate first and second frames 116, 118 (FIG. 6), 216, 218 (FIG. 7), 316, 318 (FIG. 8) formed as mesas of microlens material, color filter array material, and planarization layer material, respectively, any other material layer of the integrated circuits (100, 200, 300 of FIGS. 6-8) could be used to form the first and second frames. For example, as illustrated in FIG. 8, the planarization layer 391 is formed over various material layers 320a, 320b, 320c, 320d. Any of the various material layers 320a, 320b, 320c, 320d, which are typically inter-layer dielectric materials, could be formed with mesas to form first and second frames (e.g., first and second frames 316, 318) as long as subsequent processing does not planarized the mesa structures.

Figure 9:
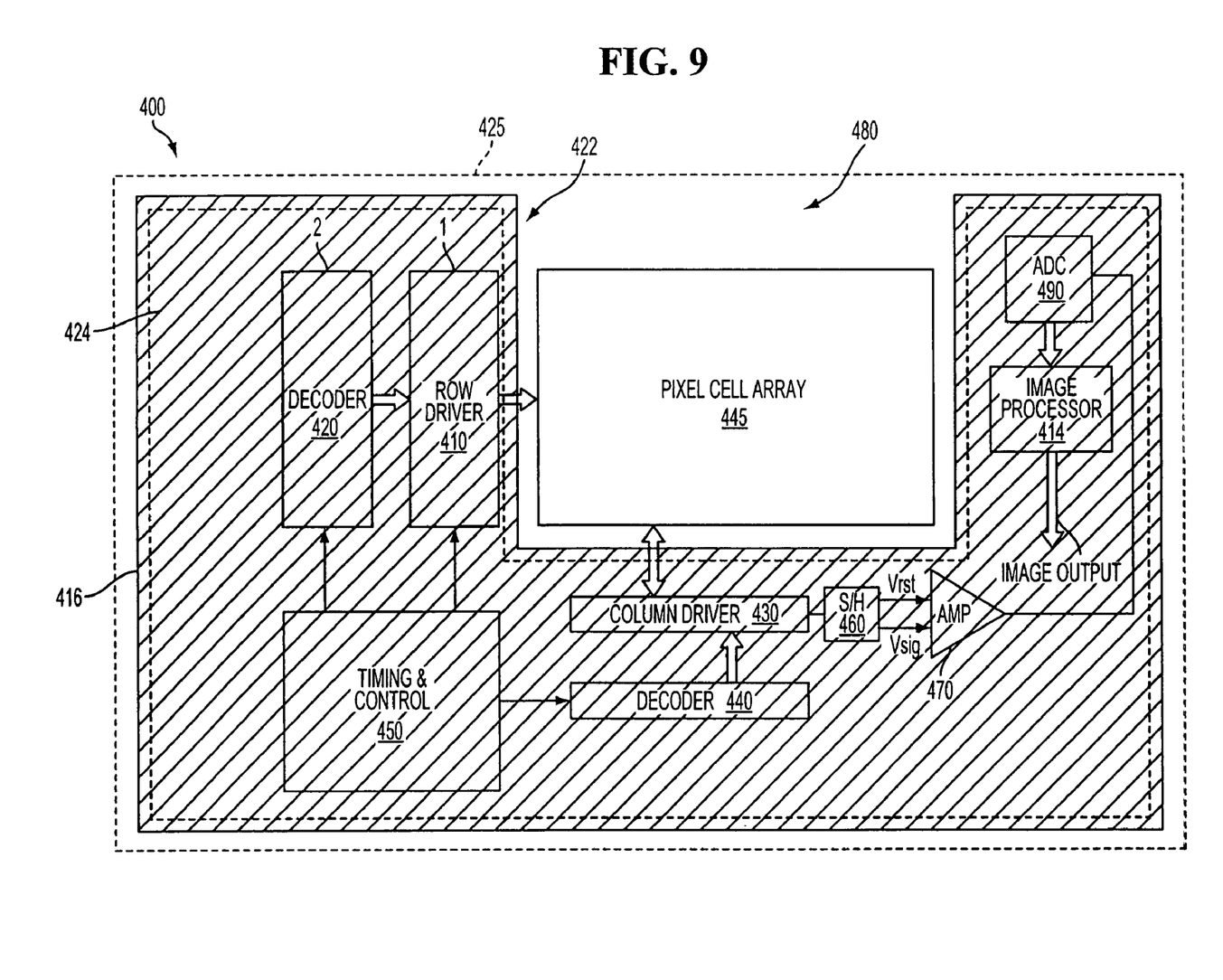
FIG. 9 illustrates a block diagram of an integrated circuit constructed in accordance with a fourth exemplary embodiment of the invention.

FIG. 9 illustrates an integrated circuit 400 constructed in accordance with a fourth exemplary embodiment of the invention. The integrated circuit 400 has an imager device 480 formed on a die 425. Like the FIG. 2 imager device 180 (FIG. 2), the FIG. 9 imager device 480 includes a pixel cell array 445, and peripheral readout circuitry 422 comprising a row driver 410, column driver 430, row decoder 420, column decoder 440, timing and control circuit 450, analog-to-digital converter 490, sample and hold circuit 460, differential amplifier 470, and an image processor 414. Unlike the FIG. 2 embodiment, however, the FIG. 9 integrated circuit 400 has a single frame 416 forming a perimeter around the peripheral circuitry 422. The single frame 416 is a continuous frame that forms a perimeter around the peripheral circuitry within which a material layer 424 is subsequently formed, as illustrated in FIG. 9. The material layer 424 is coupled to the single frame 416 in a substantially similar manner as described above with respect to FIGS. 5 and 6.

The FIG. 9 integrated circuit 400 is constructed in a substantially similar fashion as the FIG. 2 integrated circuit 100. The FIG. 9 integrated circuit 400 could have a single frame 416 that is formed of a material layer, such as the planarization precursor layer, color filter array precursor layer, or microlens array precursor layer, used in the fabrication of the integrated circuit.

Figure 10:
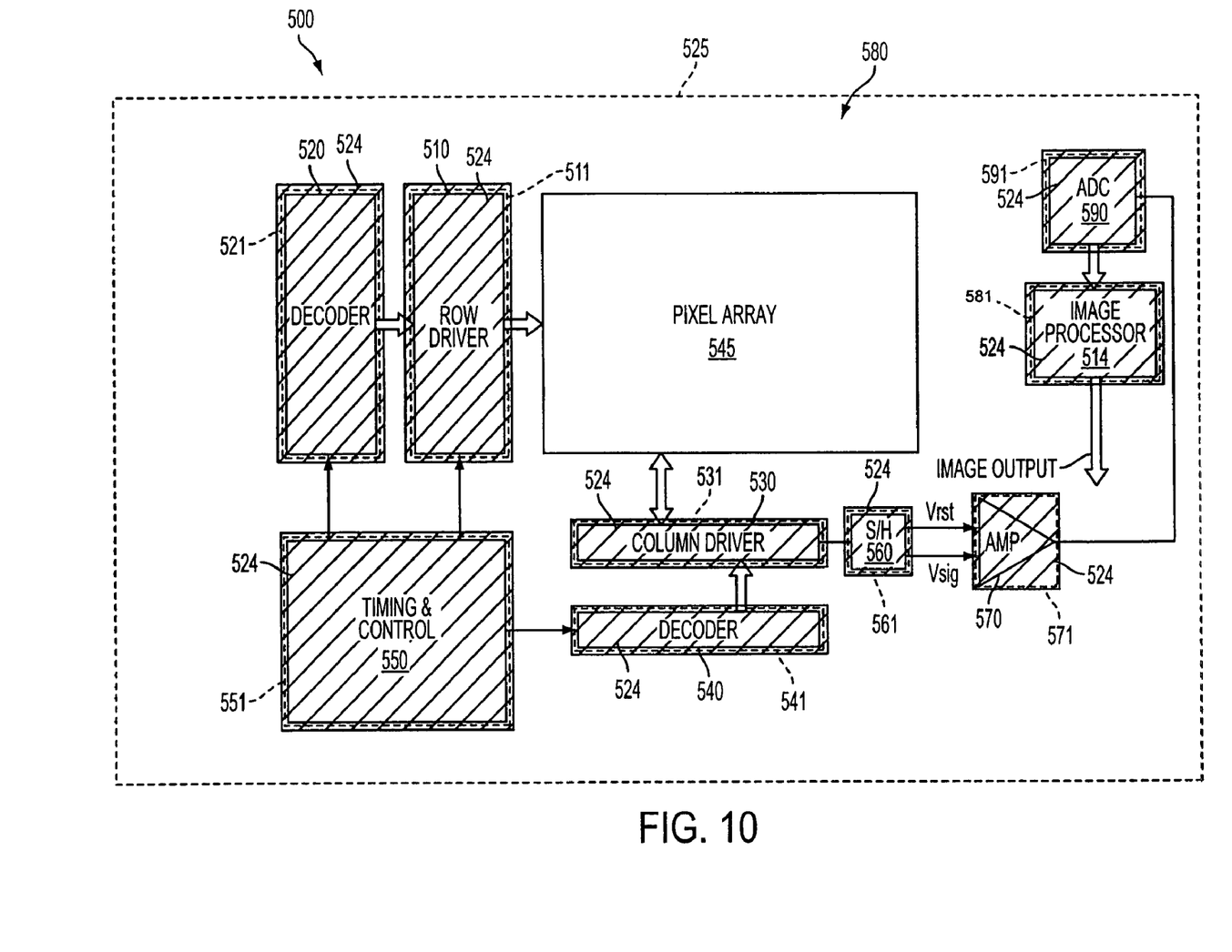
FIG. 10 illustrates a block diagram of an integrated circuit constructed in accordance with a fifth exemplary embodiment of the invention.

FIG. 10 illustrates an integrated circuit 500 constructed in accordance with a fifth embodiment of the invention. The integrated circuit 500 includes an imager device 580 formed on a die 525. The imager device 580 includes components that comprise peripheral circuitry 522. Each component of the peripheral circuitry 522 has a respective frame forming a perimeter around the component. The FIG. 10 integrated circuit 500 includes a row driver 510, column driver 530, row decoder 520, column decoder 540, timing and control circuit 550, analog-to-digital converter 590, sample and hold circuit 560, differential amplifier 570, and an image processor 514. Accordingly, the integrated circuit 500 includes a row driver frame 511, column driver frame 531, row decoder frame 521, column decoder frame 541, timing and control circuit frame 551, analog to digital converter frame 591, sample and hold circuit frame 561, amplifier frame 571, and an image processor frame 581. A material layer 524 is formed over each component of the peripheral circuitry 522, and coupled to a respective frame, as discussed above with respect to FIGS. 5 and 6.

Figure 11:
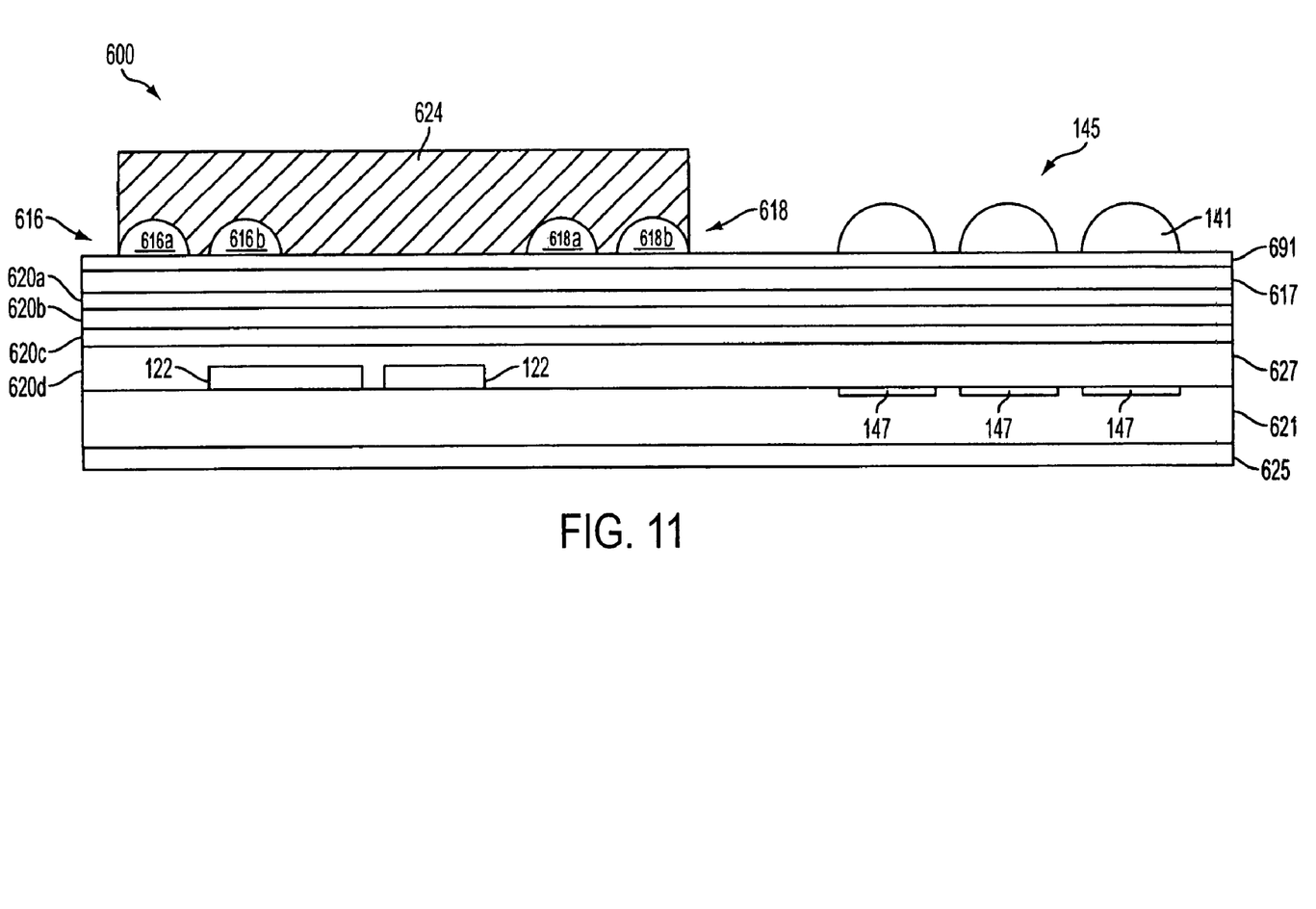
FIG. 11 illustrates a partial cross-sectional view of an integrated circuit constructed in accordance with a sixth exemplary embodiment of the invention.

FIG. 11 illustrates an integrated circuit 600 constructed in accordance with a sixth embodiment of the invention. The illustrated integrated circuit 600 has a first frame 616 having first and second portions 616a, 616b and a second frame 618 having first and second portions 618a, 618b formed over a planarization layer 691, which is formed over a die 625. A material layer 624 is formed over and coupled to the first and second frames 616, 618 in a substantially similar fashion as the FIG. 6 integrated circuit 100. The material layer 624 may be secured at four separate points by dividing each of the first and second frames 616, 618 into two portions 616a, 616b and 618a, 618b, respectively, thereby providing greater durability to the overall integrated circuit 600.

Although illustrated as having a semi-spherical cross-sectional shape, the first and second portions 616a, 616b and 618a, 618b of the first and second frames 616, 618, respectively, are not so limited. For example, as discussed above with respect to FIG. 6, the first and second frames 616, 618 could be formed to have first and second portions 616a, 616b and 618a, 618b, respectively, that have a substantially semi-elliptical, substantially semi-circular, or substantially trapezoidal shape. Similarly, any of the material layers 620a, 620b, 620c, 620d could comprise the first and second frames 616, 618, each having first and second portions 616a, 616b and 618a, 618b, respectively.

Figure 12:
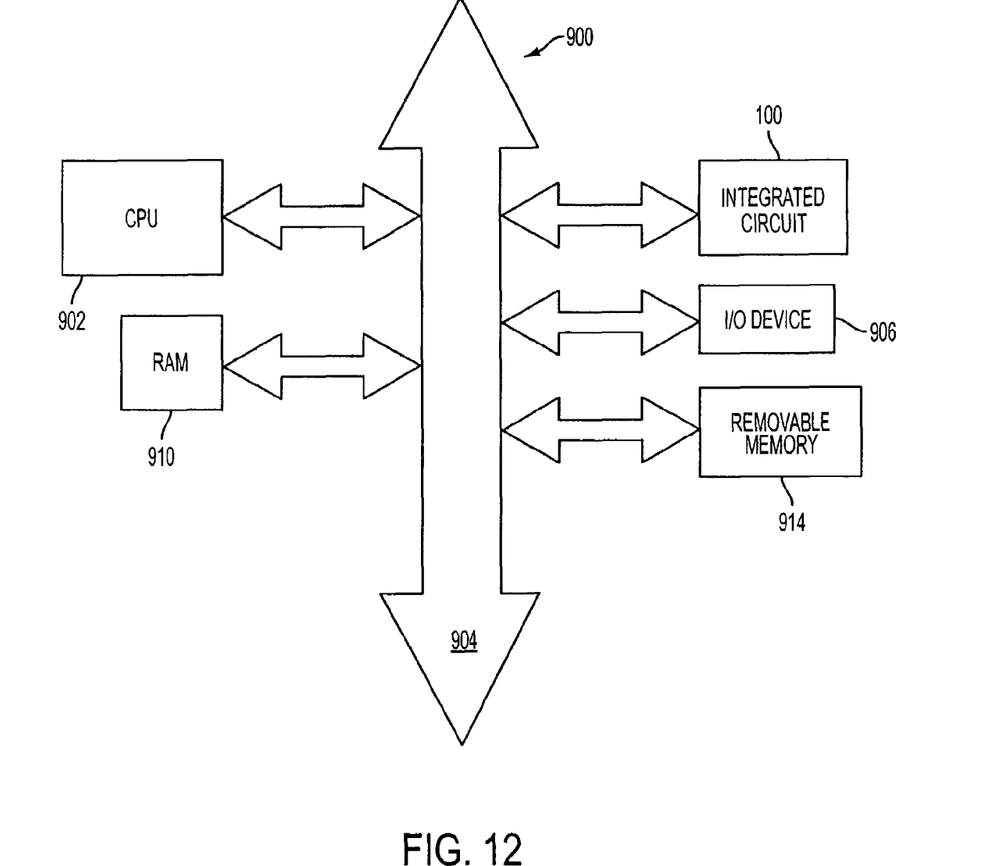
FIG. 12 is a block diagram of a processor system incorporating the FIG. 2 integrated circuit in accordance with an exemplary embodiment of the invention.

FIG. 12 is a block diagram of a system 900 having an integrated circuit in accordance with one of the embodiments (e.g., integrated circuits 100, 200, 300, 400, 500, 600 of FIGS. 2, 7, 8, 9, 10, 11) of the invention. Without being limiting, such a system 900 could include a computer system, camera system, scanner, machine vision, vehicle navigation, video phone, surveillance system, auto focus system, star tracker system, motion detection system, image stabilization system, and other systems employing an integrated circuit having an imager device (e.g., imager device 180, 480, 580 of FIGS. 2, 9, 10). For the sake of clarity, FIG. 12 is further discussed as incorporating the integrated circuit 100 of FIG. 2. It should be noted, however, that any of the integrated circuits discussed with respect to FIGS. 2, 7, 8, 9, 10 and 11 (i.e., integrated circuits 200, 300, 400, 500, 600) could be incorporated into the FIG. 12 system 900, and that the description is not intended to be limiting in any way.

System 900, for example a camera system, generally comprises a central processing unit (CPU) 902, such as a microprocessor, that communicates with an input/output (I/O) device 906 over a bus 904. Integrated circuit 100 also communicates with the CPU 902 over the bus 904. The processor-based system 900 also includes random access memory (RAM) 910, and can include removable memory 914, such as flash memory, which also communicate with the CPU 902 over the bus 904. The integrated circuit 100 may be combined with a processor, such as a CPU, digital signal processor, or microprocessor, with or without memory storage on a single integrated circuit or on a different chip than the processor.

The above description and drawings illustrate preferred embodiments which achieve the objects, features, and advantages of the invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. An integrated circuit, comprising:
   a die;
   a pixel cell array formed in association with a semiconductor substrate incorporated on the die;
   a plurality of microlenses formed over a first material layer and the pixel cell array;
   peripheral circuitry formed in association with the die and electrically connected to the pixel cell array;
   a frame element forming a perimeter around the peripheral circuitry, the frame element having at least one recess defined by at least two portions of the frame element; and
   a substantially opaque material formed within the frame element recess and over the at least two portions to form an interface between the frame element and the substantially opaque material.

2. The integrated circuit of claim 1, wherein the frame element is formed over the first material layer.

3. The integrated circuit of claim 1, wherein the frame element is formed as at least two mesas of a second material formed over the semiconductor substrate included within the integrated circuit.

4. The integrated circuit of claim 1, wherein the first material layer is a planarization layer.

5. The integrated circuit of claim 1, wherein the frame element is formed as at least two mesa portions of the first material layer.

6. The integrated circuit of claim 1, wherein the substantially opaque material comprises a negative photoresist.

7. The integrated circuit of claim 1, wherein the frame element and the microlenses are comprised of a same material.

8. The integrated circuit of claim 1, wherein the frame element and the microlenses are formed on a same horizontal plane as the first material layer.

9. The integrated circuit of claim 1, wherein the pixel cell array further comprises a color filter array, and the frame element and color filter array are comprised of a same material.

10. The integrated circuit of claim 9, wherein the frame element and the color filter array are formed on a same horizontal plane as the first material layer.

11. The integrated circuit of claim 1, wherein the substantially opaque material has a sidewall surface substantially planar to a surface of one of the portions defining the recess.

12. The integrated circuit of claim 1, wherein the frame element is formed of a negative photoresist.

13. The integrated circuit of claim 1, wherein a thickness of the substantially opaque material within the recess is less than a thickness of the substantially opaque material over the at least two portions.

14. An imager processor system, comprising:
a processor; and
an integrated circuit, comprising;
  a die;
  a pixel cell array formed in association with a semiconductor substrate incorporated on the die;
  circuitry formed in association with the die and electrically connected to the pixel cell array;
  a frame element formed by a first mesa and a second mesa, the first and second mesas defining at least one via having a bottom surface substantially planar to a bottom surface of at least one microlens of a plurality of microlenses formed over the pixel cell array, the first and second mesas forming a perimeter around the circuitry; and
  a substantially opaque material formed within the via and over portions of the first and second mesas to form an interface between the frame element and the substantially opaque material.

15. The processor system of claim 14, wherein the substantially opaque material and the plurality of microlenses are formed on a first material layer.

16. The processor system of claim 14, wherein the first mesa, the second mesa, and the plurality of microlenses are formed of a same material.

17. The processor system of claim 14, wherein the first and second mesas are formed as portions of a material layer extending through and above a planarization layer.

18. The processor system of claim 14, wherein the substantially opaque material comprises a negative photoresist.

19. The processor system of claim 14, wherein the first and second mesas are formed on a material layer on which the plurality of microlenses are formed.

20. The processor system of claim 14, wherein a thickness of the substantially opaque material within the via is less than a thickness of the substantially opaque material over the first and second mesas.

21. An integrated circuit, comprising:
a die having a pixel array and peripheral circuitry;
a frame element forming a perimeter around the peripheral circuitry, the frame element having at least one recess defined by at least two portions of the frame element; and
a substantially opaque material formed within the frame element recess and over the at least two portions to form an interface between the frame element and the substantially opaque material, the substantially opaque material being over the peripheral circuitry but not the pixel array.

22. The integrated circuit of claim 21, further comprising a plurality of microlenses formed over a first material and the pixel cell array, wherein the frame element is formed over the first material.

23. The integrated circuit of claim 21, wherein the frame element is formed as at least two mesas of a second material formed over the semiconductor substrate included within the integrated circuit.

24. The integrated circuit of claim 21, wherein the first material is a planarization layer.

25. The integrated circuit of claim 21, wherein the frame element is formed as at least two mesa portions of the first material.

26. The integrated circuit of claim 21, wherein the frame element and the microlenses are comprised of a same material.

27. The integrated circuit of claim 21, wherein the pixel cell array further comprises a color filter array, and the frame element and color filter array are comprised of a same material.

28. The integrated circuit of claim 21, wherein a thickness of the substantially opaque material within the recess is less than a thickness of the substantially opaque material over the at least two portions.

* * * * *

UNITED STATES PATENT AND TRADEMARK OFFICE
CERTIFICATE OF CORRECTION

PATENT NO. : 7,608,875 B2  Page 1 of 1
APPLICATION NO. : 11/289553
DATED : October 27, 2009
INVENTOR(S) : Yang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 835 days.

Signed and Sealed this

Twelfth Day of October, 2010

David J. Kappos
*Director of the United States Patent and Trademark Office*